United States Patent
Tang et al.

(10) Patent No.: US 11,991,835 B2
(45) Date of Patent: May 21, 2024

(54) METHOD FOR INCREASING ADHESION STRENGTH BETWEEN A METAL AND AN ORGANIC MATERIAL

(71) Applicant: Atotech Deutschland GmbH, Berlin (DE)

(72) Inventors: Felix Tang, Berlin (DE); Fabian Michalik, Berlin (DE); Thomas Thomas, Berlin (DE); Valentina Belova-Magri, Berlin (DE); Wonjin Cho, Berlin (DE); Ting Xiao, Berlin (DE); Michael Merschky, Berlin (DE); Tatjana Königsmann, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 454 days.

(21) Appl. No.: 17/433,806

(22) PCT Filed: Feb. 27, 2020

(86) PCT No.: PCT/EP2020/055192
§ 371 (c)(1),
(2) Date: Aug. 25, 2021

(87) PCT Pub. No.: WO2020/178146
PCT Pub. Date: Sep. 10, 2020

(65) Prior Publication Data
US 2022/0151080 A1    May 12, 2022

(30) Foreign Application Priority Data

Mar. 1, 2019    (EP) .................... 19160357

(51) Int. Cl.
| | |
|---|---|
| *C09J 4/00* | (2006.01) |
| *B32B 7/12* | (2006.01) |
| *B32B 15/08* | (2006.01) |
| *B32B 15/20* | (2006.01) |
| *C07F 7/18* | (2006.01) |
| *H05K 3/38* | (2006.01) |

(52) U.S. Cl.
CPC .............. *H05K 3/389* (2013.01); *B32B 7/12* (2013.01); *B32B 15/08* (2013.01); *B32B 15/20* (2013.01); *C07F 7/1804* (2013.01); *C09J 4/00* (2013.01); *H05K 2203/124* (2013.01)

(58) Field of Classification Search
CPC .... H05K 3/389; H05K 2203/124; B32B 7/12; B32B 15/08; B32B 15/20; C07F 7/1804; C09J 4/00
See application file for complete search history.

(56) References Cited

U.S. PATENT DOCUMENTS

2016/0368935 A1    12/2016    Miura et al.

FOREIGN PATENT DOCUMENTS

| EP | 3310137 A1 * | 4/2018 | ............ H05K 1/119 |
|---|---|---|---|
| EP | 3310137 B1 | 4/2018 | |
| JP | 06279461 A | 10/1994 | |
| JP | 07286160 A | 10/1995 | |
| JP | 2014240522 A | 12/2014 | |
| JP | 2015010079 A | 1/2015 | |
| JP | 2018016865 | 2/2018 | |
| JP | 2018172759 A | 11/2018 | |

OTHER PUBLICATIONS

STIC Search result (Year: 2023).*
PCT/EP2020/055192; International Search Report and Written Opinion of the International Searching Authority dated May 15, 2020.
J. Balaji et al.; "Corrosion protection of copper with 3-glycidoxypropyltrimethoxysilane-based sol-gel coating through 3-amino-5-mercapto-1,2,4-triazole doping", Journal of Research on Chemical Intermediates, vol. 42, Issue 2, pp. 1315 to 1328, 2015.

* cited by examiner

*Primary Examiner* — Hai Y Zhang
(74) *Attorney, Agent, or Firm* — Renner, Otto, Boisselle & Sklar, LLP

(57) ABSTRACT

The present invention relates to a method for increasing adhesion strength between a surface of a metal, a metal alloy or a metal oxide and a surface of an organic material comprising as a main step contacting of at least one section of said metal, metal alloy or metal oxide with a specific azole silane compound, a specific azole silane oligomer, or a mixture comprising said compound and/or said oligomer. Furthermore, the present invention relates to a use of said specific azole silane compound, said specific azole silane oligomer, or said mixture in a method for increasing adhesion strength between a surface of a metal, a metal alloy or a metal oxide and a surface of an organic material.

15 Claims, No Drawings

METHOD FOR INCREASING ADHESION STRENGTH BETWEEN A METAL AND AN ORGANIC MATERIAL

This application is a national phase of International Application No. PCT/EP2020/055192 filed 27 Feb. 2020, which claims priority to European Patent Application No. 19160357.0 filed 1 Mar. 2019, the entireties of which are hereby incorporated by reference.

FIELD OF THE INVENTION

The present invention relates to a method for increasing adhesion strength between a surface of a metal, a metal alloy or a metal oxide and a surface of an organic material comprising as a main step contacting of at least one section of said metal, metal alloy or metal oxide with a specific azole silane compound, a specific azole silane oligomer, or a mixture comprising said compound and/or said oligomer. Furthermore, the present invention relates to a use of said specific azole silane compound, said specific azole silane oligomer, or said mixture in a method for increasing adhesion strength between a surface of a metal, a metal alloy or a metal oxide and a surface of an organic material.

BACKGROUND OF THE INVENTION

In the Semi Additive Process build up sequence used in production of Integrated Circuit (IC) Substrates one of the key tasks is to form a strong adhesive bond between adjacent layers where there is intrinsically no natural adhesive force. The fundamental challenge here is to form a strong bond between the metal traces and the dielectric materials used in either build up layers or final soldermasks coatings, with no negative impact upon final product performance.

In former times the most commonly used adhesion promotor systems provided a high degree of roughening of the metal surface; this roughened surface can then act as a key to form mechanical bonds with the dielectric materials (e.g. organic resin systems) and the metal traces. However, this type of system which is based upon a maximum increase in metal surface area for a minimum amount of metal removed is now no longer acceptable.

As conductor features become smaller and smaller it is ever more challenging to form reliable structures to the desired line and space tolerance, therefore it is totally undesirable to introduce an adhesion promotor step based upon a high degree of surface roughening.

In addition, a second challenge is now faced with the advent 5G systems where there is strong relationship between signal integrity and surface roughening. As the frequency and rate of data transfer of the electrical signal increase, the path of the electrical signal moves into the outer most skin of the metal trace. Obviously if this "skin" has been highly roughened to increase adhesion with buildup layers there is a much higher risk that some of the signal will be lost or slowed down. With any such loss then the ability to perform at the required high frequency range is also impaired.

To overcome these challenges, it is desired to develop a method for a treatment of the metal surface and/or the dielectric materials in which the adhesion between both materials is increased without etching and/or roughening of the metal surface.

Azole silane compounds are frequently utilized in the manufacturing of electronic components, in particular in surface treatment solutions, e.g. for the treatment of metal surfaces and surfaces of organic materials as a preparation for further processing steps.

US 2016/0368935 A1 relates to an azole silane compound, and a surface treatment solution using the azole silane compound, a surface treatment method and use thereof.

JP 2018016865 A discloses a triazole surface treatment agent containing a silane compound.

JP 2014240522 A refers to a copper surface treatment liquid, a surface treatment method, and its utilization.

JP H06279461 A refers to a surface-treating agent for copper foils used for copper-clad laminate boards for printed circuits.

The article "Corrosion protection of copper with 3-glycidoxypropyltrimethoxysilane-based sol-gel coating through 3-amino-5-mercapto-1,2,4-triazole doping", Journal of Research on Chemical Intermediates, Volume 42, Issue 2, pages 1315 to 1328, 2015, discloses a study about corrosion protection of copper in a neutral medium by the formation of a sol-gel coating over the copper surface. It discloses that a 3-amino-5-mercapto-1,2,4-triazole-doped 3-glydidoxypropyltrimethoxysilane-based sol-gel coating on copper forms a thiolate bond to copper.

Objective of the Present Invention

It was therefore the objective of the present invention, based on the above-mentioned problems, to provide a method for a treatment of the metal surface and/or the dielectric materials in which the adhesion between both materials is increased, preferably without etching and/or roughening of the metal surface.

DESCRIPTION OF THE INVENTION

Above mentioned objective is solved by a method for increasing adhesion strength between a surface of a metal, a metal alloy or a metal oxide and a surface of an organic material comprising the following steps in this order:
(i) providing a substrate, comprising the metal, metal alloy or metal oxide on at least one side of the substrate,
(ii) contacting at least one section of said metal, metal alloy or metal oxide with
A) an azole silane compound of formula (I)

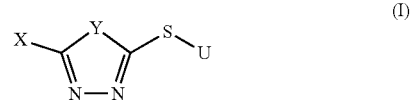

wherein
X denotes $NH_2$, $NH(NH_2)$, $NH(NHU)$, SH, $SCH_3$, $OCH_3$, NHU, or SU,
Y denotes NH, $N(NH_2)$, N(NHU), or S,
U independently denotes $CH_2$—CH(OH)—$CH_2$—O—$(CH_2)$n-$Si(OR)_3$, with R independently being $(CH_2$—$CH_2$—$O)_m$—Z, wherein independently
n is an integer in the range from 1 to 12,
m is 0, 1, 2, 3, or 4, and
Z denotes H or C1 to C5 alkyl,
and/or
B) an azole silane oligomer obtained by reacting the azole silane compounds of formula (I) with each other in the presence of water such that the azole silane oligomer comprises at least one silicon-oxygen-silicon moiety,
wherein in the compounds of formula (I) used for the reaction to form the azole silane oligomer
X denotes H, $CH_3$, $NH_2$, $NH(NH_2)$, $NH(NHU)$, SH, $SCH_3$, $OCH_3$, NHU, or SU, and
Y and U have the meanings given above,
and
(iii) applying the organic material such that the at least one section of the metal, metal alloy or metal oxide contacted with the azole silane compound and/or the azole silane oligomer during step (ii) is in contact with the applied organic material.

Own experiments have surprisingly shown that the adhesion strength between the metal, metal alloy or metal oxide and an organic material can be increased without etching or a noticeable removal of metal, metal alloy or metal oxide. The total surface area of the metal, metal alloy or metal oxide is not increased but rather remains constant during step (ii) of the method of the present invention. In other words, after step (ii) the total surface area of the metal, metal alloy or metal oxide is substantially the same compared to the start of step (ii). This differentiates the method of the present invention over a number of known methods, in particular etching methods, which have the goal to increase the total surface area by roughening. Therefore, the method of the present invention is a non-etching method.

Own experiments have also surprisingly shown that due to the OH group in the side chain (U) of the azole silane compounds of formula (I) and the azole silane oligomers the solubility in polar solvents is increased (compared to compounds of formula (I) or azole silane oligomers in which the OH group was replaced by Hydrogen). As a result, the excessive azole silane compound or azole silane oligomers can be removed after step (ii) by conventional wet-chemical methods and a plasma treating has not to be conducted.

Preferred is a method of the present invention, wherein in step (i) the metal, metal alloy or metal oxide comprises a metal, metal alloy or metal oxide circuitry, preferably is a metal, metal alloy or metal oxide circuitry. In such a case the metal, metal alloy or metal oxide alloy is structured. It preferably means that the organic material simultaneously exposes on the same side non-conductive (preferably organic) areas as well as conductive metal, metal alloy or metal oxide areas. This is most preferred in the context of the method of the present invention.

Preferred is a method of the present invention, wherein in step (i) the metal, metal alloy or metal oxide forms at least one layer on the substrate. As described above this layer or these layers can be structured and can form or be a circuitry.

Preferred is a method of the present invention, wherein in step (i) (and/or preferably after step (ii)) the metal, metal alloy or metal oxide circuitry comprises lines with a line width of 100 µm or less, preferably 75 µm or less, more preferably 55 µm or less. In some cases, a method of the present invention is preferred, wherein in step (i) (and/or preferably after step (ii)) the metal, metal alloy or metal oxide circuitry comprises lines with a line width of 30 µm or less, preferably of 20 µm or less, most preferably of 10 µm or less.

The method according to the invention is preferred, wherein an aqueous solution of the azole silane compound of formula (I) and/or the azole silane oligomer is used in step (ii). In such a case it is preferred, when the aqueous solution comprises at least 51 wt.-% water, based on the total weight of the aqueous solution. Preferred is a aqueous solution, wherein in said solution water is present in a total amount in the range from 56 wt.-% to 88 wt.-%, based on the total weight of the aqueous solution, preferably in a total amount in the range from 60 wt.-% to 84.8 wt.-%, more preferably in a total amount in the range from 65 wt.-% to 82.2 wt.-%.

In order to sufficiently solubilize the azole silane compounds and the azole silane oligomers in the aqueous solution, one or more than one water miscible organic solvent is present. Preferred is a solution of the present invention, wherein in said solution the one or more than one water miscible organic solvent is present in a total amount in the range from 6 wt.-% to 44 wt.-%, based on the total weight of the aqueous solution, preferably in a total amount in the range from 8 wt.-% to 43.9 wt.-%, more preferably in a total amount in the range from 13 wt.-% to 39.7 wt.-%, most preferably in a total amount in the range from 16 wt.-% to 34.5 wt.-%.

In the context of the present invention, azole silane compounds as well as azole silane oligomers and the solution used in step (ii) of the present invention are initially free of halides. This means on the one hand that said compounds and oligomers, respectively, are in itself free of halide atoms because no educts containing halogen atoms are utilized, and on the other hand no halide ions are present in the immediate synthesis environment. However, in a few cases it is preferred that the aqueous solution of the present invention comprises a precisely defined amount of halide ions. Therefore, in some cases an aqueous solution as used in step (ii) of the present invention is preferred further comprising halide ions, preferably chloride ions.

However, in other cases it is preferred that the (aqueous) solution as used in step (ii) of the present invention is substantially free of, preferably does not comprise, chloride ions, more preferably is substantially free of, preferably does not comprise, halide ions.

As mentioned above the method according to the invention is preferred, wherein the aqueous solution further comprises one or more than one water miscible organic solvent. In such a case it is preferred, when the one or more than one water miscible organic solvent comprises a water-miscible organic solvent selected from the group consisting of C1 to C4 alcohols, glycol ethers, and mixtures thereof, preferably selected from the group consisting of
  C1 to C3 alcohols,
  HO—$(CH2\text{-}CH2\text{-}O)_m$—Z, wherein
    m is 1, 2, 3, or 4, preferably 1 or 2, and
    Z denotes C1 to C5 alkyl, preferably C3 to C5 alkyl,
  and mixtures thereof, more preferably
  selected from the group consisting of methanol, diethylene glycol monobutyl ether, ethylene glycol monobutyl ether, and mixtures thereof, even more preferably
  selected from the group consisting of diethylene glycol monobutyl ether, ethylene glycol monobutyl ether, and mixtures thereof.

In each case, glycol ethers are more preferred than alcohols. Glycol ethers typically provide an improved stabilization compared to said alcohols. Furthermore, alcohols in general exhibit a low flash point compared to glycol ethers, which makes alcohols potentially dangerous in terms of fire hazard. A comparatively high flash point is usually desired in order to prevent an ignition. Thus, glycol ethers typically provide the desired solubility, stability and security.

The method according to the invention is preferred, wherein the total amount of the azole silane compounds and the azole silane oligomers together is 5 wt.-% or less, based on the total weight of the (aqueous) solution.

Above term "5 wt.-% or less" does not include zero wt.-%. This means that said total amount is always >0 wt.-%, preferably at least 0.1 wt.-%.

Preferably the total amount of all azole silane compounds (as described throughout the present text, preferably as described as being preferred) and all azole silane oligomers (as described throughout the present text, preferably as described as being preferred) together is in the range from 0.1 wt.-% to 4 wt.-%, based on the total weight of the aqueous solution, preferably is in the range from 0.2 wt.-% to 3 wt.-%, more preferably is in the range from 0.3 wt.-% to 2.2 wt.-%, even more preferably in the range from 0.4 wt.-% to 2.0 wt.-%, most preferably is in the range from 0.5 wt.-% to 1.8 wt.-%.

Own experiments have shown that the individual presence of the one or more than one azole silane compound and the one or more than one azole silane oligomer varies over time. In a freshly prepared aqueous solution typically the total weight of azole silane compounds is higher than the total weight of azole silane oligomers. However, over time upon utilizing the aqueous solution the total weight of said azole silane oligomers drastically increases, possibly even up to the point that the total weight of said azole silane oligomers is higher than the total weight of said azole silane compounds. Furthermore, the handling of the aqueous solution also affects the total weights of said compounds and oligomers, respectively. For example, a significant drag out during utilizing the aqueous solution and a corresponding replenishment with fresh aqueous solution typically leads to a steady state condition in terms of azole silane compound(s) vs. azole silane oligomer(s).

It is also possible to isolate one or more azole silane oligomer(s) and to use just the azole silane oligomer(s) in step (ii) of the method according to the present invention.

The method according to the invention is preferred, wherein the aqueous solution has a pH in the range from 4.8 to 8.6, preferably in the range from 4.8 to 8.0.

In the context of the present invention, the pH is referenced to a temperature of 20° C.

More preferred is an aqueous solution, wherein the pH is in the range from 5.6 to 7.9, more preferably in the range from 5.8 to 7.7, most preferably in the range from 6.5 to 7.5. A pH in the range from 4.8 to 8.6 supports at least to a certain degree an oligomerization of the azole silane compounds, which is desired. Own experiments have shown that if the pH is significantly below pH 4.8 or significantly above pH 8.0 undesired and strong precipitation is often observed. Furthermore, a total amount of all azole silane compounds and all azole silane oligomers of 5 wt.-% or less, based on the total weight of the solution, and said solution primarily being an aqueous solution, results in a sufficiently stable solution. This means that with such a total amount and such a pH in an aqueous environment precipitation can be significantly avoided.

Due to the method according to the invention the adhesion strength (e.g. peel strength) between a metal and an organic material can be increased without using any etch-cleaning steps. But some cases—especially cases where a surface roughness of the metal surface does not affect the quality of the circuits—a further etch-cleaning step can be performed. In this case the adhesion strength between a metal and an organic material can be increased even further.

The method according to the invention is preferred, additionally comprising the following step before conducting step (ii): (i-a) contacting the at least one section of said metal, metal alloy or metal oxide with an etch-cleaning solution, preferably an etch-cleaning solution containing one or more than one acid and/or one or more than one oxidizing agent, more preferably an etch-cleaning solution containing a mixture of an inorganic acid and a peroxide (preferably a mixture of sulfuric acid and hydrogen peroxide).

According to the present invention it is preferred, when the oxidizing agent is a peroxide, more preferably when the peroxide is hydrogen peroxide.

According to the present invention it is preferred, when the etch-cleaning solution comprises in addition to the acid and/or to the one or more than one oxidizing agent a corrosion inhibitor.

The method according to the invention is preferred, additionally comprising the following step before conducting step (ii): (i-b) contacting the at least one section of said metal, metal alloy or metal oxide with a (preferably second) etch-cleaning solution. In case step (i-b) is carried out after step (i-a) the used etch-cleaning solution is the second etch-cleaning solution. In case step i-b is carried out without a previous etch-cleaning step, the used etch-cleaning solution is the first etch-cleaning solution.

According to the present invention the second etch-cleaning solution comprises an iron (III) salt or an iron (III) complex, more preferably the second etch-cleaning solution comprises ferric sulfate ($Fe_2(SO_4)_3$), ferric chloride ($FeCl_3$), bromide, ferric ($FeBr_3$), ferric nitrate ($Fe(NO_3)_3$), ferric acetate ($Fe(OC(O)CH_3)_3$), ($Fe(OH)_3$), or mixtures thereof, even more preferably the second etch-cleaning solution comprises ferric sulfate ($Fe_2(SO_4)_3$). The Ferric ion is preferably contained at a concentration in the range of 1 to 100 g/l, preferably from 1 to 50 g/l, and more preferably from 1 to 30 g/l.

According to the present invention the second etch-cleaning solution preferably comprises in addition to the iron (III) salt or an iron (III) complex an acid, preferably sulfuric acid.

According to the present invention, a typical metal, metal alloy or metal oxide removal during step i-a and/or i-b is less than 200 nm and resulting surface roughness is a maximum of 100 nm.

The method according to the invention is preferred, additionally comprising the following step before conducting step (ii): (i-c) contacting the at least one section of said metal, metal alloy or metal oxide with an aqueous alkaline solution, preferably an aqueous sodium hydroxide solution. It is preferred if the aqueous alkaline solution contain metal complexing agents.

In some embodiments of the present invention it is preferred if the aqueous alkaline solution used in step i-c additionally contains sodium chlorite. The use of sodium chlorite in the aqueous alkaline solution used in step i-c is especially preferred if in step i-b no iron (III) salt or an iron (III) complex is used or if step i-b is not performed during the method according to the present invention.

The order of the steps (i-a), (i-b), and (i-c) may vary. The method according to the invention can be carried out in the following order: (i-a), (i-b), (i-c), or (i-a), (i-c), (i-b), or (i-b), (i-a), (i-c), or (i-b), (i-c), (i-a), or (i-c), (i-a), (i-b), or (i-c), (i-b), (i-a). The order (i-a), (i-b), (i-c) is preferred. It is also possible that none, one or two of the steps (i-a), (i-b), (i-c) are performed in the method according to the invention.

The method according to the invention is preferred, wherein the organic material applied in step (iii) is an organic polymer.

The method according to the invention is preferred, wherein the organic material is applied in step (iii) by laminating the organic material onto at least the contacted section of the metal, metal alloy or metal oxide.

The method according to the invention is preferred, comprising after step (iii) the additional step: (iv) subjecting the substrate and the organic material to a heat treatment with a temperature in the range from 142° C. to 420° C., preferably in the range from 145° C. to 300° C., more preferably in the range from 150° C. to 220° C.

The method according to the invention is preferred, wherein after step (ii), after step (i-a), after step (i-b) and/or after step (i-c), a rinsing of the at least one section of the metal, metal alloy or metal oxide is performed, wherein the metal, metal alloy or metal oxide is preferably rinsed with water. It is preferred if the water that is used during rinsing after step (ii) has a pH-value in the range from 4 to 10, preferably in the range from 5 to 9, more preferably in the range from 6 to 8, most preferably in the range from 6.5 to 7.5.

The method according to the invention is preferred, wherein after step (ii), after step (i-a), after step (i-b) and/or after step (i-c), a drying of the at least one section of the metal, metal alloy or metal oxide is performed.

The method according to the invention is preferred, wherein the metal, metal alloy or metal oxide is copper, aluminum, titanium, nickel, tin, iron, silver, gold, an alloy comprising at least one of the aforementioned metals (or an alloy comprising just the aforementioned metals), or a metal oxide of at least one of the aforementioned metals. The method according to the invention is especially preferred wherein the metal is copper, the metal alloy contains copper and the metal oxide is or contains a copper oxide.

A method according to the present invention is especially preferred comprising the following steps in this order:
(i) providing a substrate, comprising the metal, metal alloy or metal oxide on at least one side of the substrate,
(i-a) optionally contacting at least one section of said metal, metal alloy or metal oxide with an etch-cleaning solution, preferably an etch-cleaning solution containing one or more than one acid and/or one or more than one oxidizing agent, more preferably an etch-cleaning solution containing a mixture of an inorganic acid and a peroxide, and optionally followed by rinsing of the at least one section of the metal, metal alloy or metal oxide (preferably with water),
(i-b) optionally contacting the at least one section of said metal, metal alloy or metal oxide with a second etch-cleaning solution, wherein the second etch-cleaning solution preferably comprises ferric sulfate and sulfuric acid, and optionally followed by rinsing of the at least one section of the metal, metal alloy or metal oxide (preferably with water),
(i-c) optionally contacting the at least one section of said metal, metal alloy or metal oxide with an aqueous alkaline solution, and optionally followed by rinsing of the at least one section of the metal, metal alloy or metal oxide (preferably with water),
(ii) contacting of the at least one section of said metal, metal alloy or metal oxide with
A) an azole silane compound of formula (I)

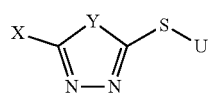

(I)

wherein
X denotes $NH_2$, $NH(NH_2)$, NH(NHU), SH, $SCH_3$, $OCH_3$, NHU, or SU,
Y denotes NH, $N(NH_2)$, N(NHU), or S,
U independently denotes $CH_2$—CH(OH)—$CH_2$—O—$(CH_2)_n$—$Si(OR)_3$, with R independently being $(CH_2$—$CH_2$—$O)_m$—Z, wherein independently
n is an integer in the range from 1 to 12,
m is 0, 1, 2, 3, or 4, and
Z denotes H or C1 to C5 alkyl,
and/or
B) an azole silane oligomer obtained by reacting the azole silane compounds of formula (I) with each other in the presence of water such that the azole silane oligomer comprises at least one silicon-oxygen-silicon moiety,
wherein in the compounds of formula (I) used for the reaction to form the azole silane oligomer
X denotes H, $CH_3$, $NH_2$, $NH(NH_2)$, NH(NHU), SH, $SCH_3$, $OCH_3$, NHU, or SU, and
Y and U have the meanings given above,
and optionally followed by rinsing of the at least one section of the metal, metal alloy or metal oxide (preferably with water),
(iii) applying the organic material such that the at least one section of the metal, metal alloy or metal oxide contacted with the azole silane compound and/or the azole silane oligomer during step (ii) is in contact with the applied organic material,
and
(iv) optionally subjecting the substrate and the organic material to a heat treatment with a temperature in the range from 142° C. to 420° C., preferably in the range from 145° C. to 300° C., more preferably in the range from 150° C. to 220° C.,
wherein preferably the metal is copper, the metal alloy contains copper and the metal oxide is or contains a copper oxide.

A method according to the present invention is preferred, wherein the substrate is a non-conductive substrate and/or the organic material is a non-conductive organic material, preferably a non-conductive organic polymer.

A method according to the present invention is preferred, wherein X denotes $NH_2$, $NH(NH_2)$, SH, SCH3, or $OCH_3$, preferably $NH_2$, $NH(NH_2)$, SH, $SCH_3$, or $OCH_3$, more preferably $NH_2$, $NH(NH_2)$, SH, or $SCH_3$, most preferably $NH_2$.

A method according to the present invention is preferred, wherein n in U is an integer in the range from 1 to 8, preferably in the range from 2 to 6, more preferably in the range from 3 to 4, most preferably n is 3.

In a very preferred method according to the present invention the azole silane compound is a compound of formula (I-I) or (I-II)

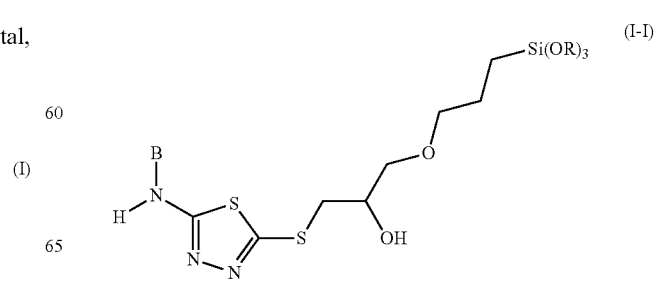

(I-I)

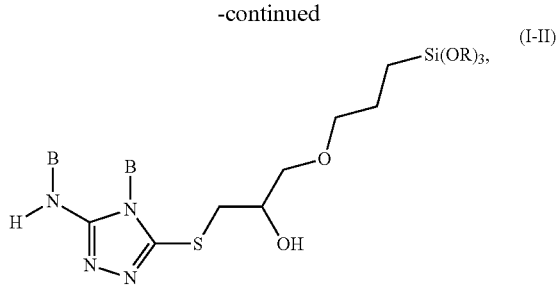

with R independently being $(CH_2-CH_2-O)_m-Z$,
wherein independently
m is 0, 1, or 2, preferably 0 or 2,
Z denotes H, $CH_3$, $CH_2-CH_3$, $(CH_2)_2-CH_3$, or $(CH_2)_3-CH_3$, preferably H, $CH_3$, or $(CH_2)_3-CH_3$,
and
B independently being selected from the group consisting of H and $NH_2$, preferably B is H.

Very preferred is a compound of formula (I-II).

In the context of the present invention the term "independently being" (or similar expressions) in combination with a certain variable denotes that a selected feature for such a variable in a first compound is independent from a selected feature of the same variable in a second compound (e.g. variable B in (I-I) and (I-II)) and, if one compound contains the same variable at least twice (e.g. variable B in (I-II)), it is independently selected from each other, and thus can be different. For example, in a compound of formula (I-II) B is independently selected from a B in a compound of formula (I-I). Therefore, both B's can be different. Furthermore, in a compound of formula (I-II) the B connected to the ring azole nitrogen is independently selected from the B in the external amine group. Thus, also in this case both B's can be different in a compound of formula (I-II). This principle likewise applies to other "independently" terms.

In a very preferred method according to the present invention the azole silane compound is a compound of formula (Ia) or (Ib)

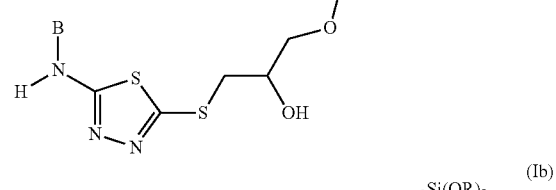

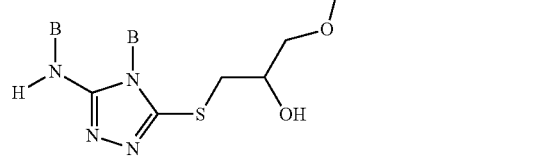

with R independently being $(CH_2-CH_2-O)_m-Z$,
wherein independently
m is 0, 1, or 2, preferably 0 or 2, and
Z denotes H, $CH_3$, $CH_2-CH_3$, $(CH_2)_2-CH_3$, or $(CH_2)_3-CH_3$, preferably H, $CH_3$, or $(CH_2)_3-CH_3$.

Most preferred in the azole silane compound used in the method of the present invention Y includes a nitrogen, respectively the azole silane compound used in the method of the present invention preferably is a compound of formula (Ib) and (I-II), respectively, as defined above.

A method according to the present invention is preferred, wherein the azole silane oligomer is selected from the group consisting of an azole silane dimer, an azole silane trimer, and an azole silane tetramer. Thus, the azole silane oligomer used in the method according to this invention is obtained by reacting in the presence of water azole silane compounds according to formula (I) preferably as described throughout the present text, more preferably as described as being preferred. This reaction of azole silane compounds with each other be called oligomerization.

Above mentioned oligomerization requires at least a little amount of water for hydrolysis in order to form at least some OH groups at various silicon atoms. Preferably, the azole silane oligomer is obtained by reacting said azole silane compounds with each other in the presence of at least 2 wt.-% of water, based on the total weight of a respective reaction composition.

In the context of the present invention, the term "azole silane oligomer" includes the combination of at least two monomers, i.e. the reaction of at least two azole silane compounds as described above with each other. Furthermore, this term includes three, four, five, six, seven, eight, nine and up to 10 monomers. Preferred is an azole silane oligomer as described above, wherein the oligomer is selected from the group consisting of an azole silane dimer, an azole silane trimer, an azole silane tetramer, an azole silane pentamer, an azole silane hexamer, an azole silane heptamer, and an azole silane octamer. More preferred is the azole silane oligomer as used in the method of the present invention, wherein the oligomer is selected from the group consisting of an azole silane dimer, an azole silane trimer, and an azole silane tetramer. The latter alternatively means that an azole silane oligomer is preferred, wherein the oligomer comprises one, two, or three silicon-oxygen-silicon moieties, respectively.

On the basis of the azole silane compound as described above a huge variety of oligomers of the present invention can be formed. Thus, the oligomers of the present invention are best and fittingly described by their reacting with each other.

In the context of the present invention, the term "at least" in combination with a value denotes (and is exchangeable with) this value or more than this value. For example, above mentioned "at least one silicon-oxygen-silicon moiety" denotes (and is exchangeable with) "one or more than one silicon-oxygen-silicon moiety". Most preferably, "at least one" denotes (and is exchangeable with) "one, two, three or more than three".

A method according to the present invention is preferred, wherein the azole silane oligomer is a compound of formula (II)

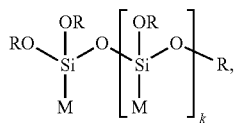

(II)

wherein
R independently denotes (CH2-CH2-O)$_m$—Z,
  wherein
  m is 0, 1, 2, 3, or 4, preferably 0, 1, or 2, and
  Z denotes H or C1 to C5 alkyl,
k is 1, 2 or 3, preferably 1 or 2, and
M independently denotes a moiety of formula (IIa)

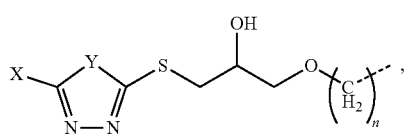

(IIa)

wherein in formula (IIa)
X denotes H, CH3, NH2, NH(NH2), SH, SCH3, or OCH3, preferably CH3, NH2, NH(NH2), SH, SCH3, or OCH3, more preferably NH2, NH(NH2), SH, or SCH3, most preferably NH2,
Y denotes NH, N(NH2), or S, preferably NH, and
n denotes an integer in the range from 1 to 12, preferably in the range from 1 to 8, more preferably in the range from 2 to 6, even more preferably in the range from 3 to 4, most preferably n is 3.

In above moiety of formula (IIa) the dashed line denotes the covalent bond connecting the whole moiety with a silicon atom depicted in formula (II).

Only in a few cases an azole silane oligomer as used in the method according to the present invention is even preferred, wherein k is an integer in the range from 1 to 7, preferably in the range from 1 to 5. However, most preferably k is 1, 2 or 3, preferably 1 or 2.

Preferably, the azole silane oligomer as used in the method according to the present invention is a homooligomer. This means that preferably identical monomers are combined with each other to form the oligomer.

Alternatively, preferred is that in an azole silane oligomer as used in the method according to the present invention at least all those moieties not forming the silicon-oxygen-silicon backbone (i.e. the azole moieties and the ether moieties which are linking the azole moieties to the silicon atom) are identical in their chemical formulae. In such a case, m preferably is not independently defined.

The azole silane compound and the azole silane oligomer as used in step (ii) of the method of the present invention can be present as a mixture. Typically, an organic solvent facilitates solubility of the mixture. Thus, in step (ii) of the method according to the present invention also a mixture can be used comprising, preferably consisting of,
  (a)—one or more than one azole silane compound (as described throughout the present text, preferably as described as being preferred),
    and/or (preferably and)
  one or more than one azole silane oligomer (as described throughout the present text, preferably as described as being preferred),
    and
  (b)—one or more than one organic solvent and/or water.

Preferably the mixture is substantially free of, preferably does not comprise, halide ions.

In the context of the present invention, the term "substantially free" of a subject-matter (e.g. a compound, a material, etc.) denotes that said subject-matter is not present at all or is present only in (to) a very little and undisturbing amount (extent) without affecting the intended purpose of the invention. For example, such a subject-matter might be added or utilized unintentionally, e.g. as unavoidable impurity. "Substantially free" preferably denotes 0 (zero) ppm to 50 ppm, based on the total weight of the mixture (if defined for said mixture), preferably 0 ppm to 25 ppm, more preferably 0 ppm to 10 ppm, even more preferably 0 ppm to 5 ppm, most preferably 0 ppm to 1 ppm. Zero ppm denotes that a respective subject-matter is not comprised at all, which is most preferred.

Preferred is an solution or mixture as used in step (ii) of the present invention (as described throughout the present text, preferably as described as being preferred), wherein all azole silane compounds (as described throughout the present text, preferably as described as being preferred) and all azole silane oligomers (as described throughout the present text, preferably as described as being preferred) represent at least 70 wt.-% of the total weight of all azole silane compounds and oligomers in said solution, respectively, preferably represent at least 80 wt.-%, more preferably represent at least 90 wt.-%, even more preferably represent at least 93 wt.-%, most preferably represent at least 95 wt.-%, even most preferably represent at least 98 wt.-%. It is most preferred that no other azole silane compounds or oligomers are present, except those as described throughout the present text, preferably as described as being preferred. This also means that the absolute total amounts of azole silane compounds and azole silane oligomers together (as defined in the very text above) very preferably apply with the proviso that no other azole silane compounds and azole silane oligomers are present in solution. Therefore, the mixture is substantially free of, preferably does not comprise, any other azole silane compounds and azole silane oligomers.

Furthermore, preferred is an mixture or solution (as described throughout the present text, preferably as described as being preferred), wherein all azole silane compounds (as described throughout the present text, preferably as described as being preferred) and all azole silane oligomers (as described throughout the present text, preferably as described as being preferred) represent at least 51 mol-% of all compounds comprising at least one silicon atom in said mixture or solution, respectively, preferably represent at least 60 mol-%, more preferably represent at least 70 mol-%, most preferably represent at least 80 mol-%, even most preferably represent at least 90 mol-%.

Preferred is a mixture, wherein the one or more than one organic solvent comprises a solvent selected from the group consisting of acetone, 1,3-dioxolane, acetonitrile, 1,4-dioxane, methanol, ethanol, 1-propanol, 2-propanol, t-butanol, prop-2-en-1-ol, ethyl lactate, ethylene glycol monomethyl ether acetate, N,N-dimethylformamide, 2-butoxyethanol, di(propylene glycol) methyl ether, tetrahydrofurfuryl alcohol, N-methyl-2-pyrrolidone, 2-(2-methoxyethoxy)ethanol, gamma-butyrolactone, ethylene glycol, propylene glycol, dipropylene glycol, epsilon-caprolactone, diethylene glycol monobutyl ether, ethylene glycol monobutyl ether, tetrahydrothiophene-1-oxide, diethylene glycol monobutyl ether acetate, propylene carbonate, sulfolane, glycerol, and mixtures thereof.

Very preferred is a mixture, wherein the one or more than one organic solvent comprises a solvent selected from the group consisting of methanol, ethanol, 1-propanol, 2-propanol, t-butanol, di(propylene glycol) methyl ether, ethylene glycol, propylene glycol, dipropylene glycol, diethylene glycol monobutyl ether, ethylene glycol monobutyl ether, and mixtures thereof.

In a few cases very preferred is a mixture, wherein the one or more than one organic solvent comprises a solvent selected from the group consisting of glycol ethers, preferably selected from the group consisting of di(propylene glycol) methyl ether, diethylene glycol monobutyl ether, ethylene glycol monobutyl ether, and mixtures thereof.

The azole silane compound of formula (I) as described above can be synthesis by a method comprising the steps of
(a) providing an azole compound of formula (III)

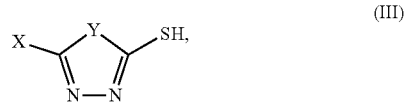

(III)

wherein
X denotes H, $CH_3$, $NH_2$, $NH(NH_2)$, SH, $SCH_3$, or $OCH_3$,
Y denotes NH, $N(NH_2)$, or S,
(b) providing a silane compound of formula (IV)

(IV)

wherein in formula (IV)
R denotes $(CH_2-CH_2-O)_m-Z$, wherein independently
m is 0, 1, 2, 3, or 4, and
Z denotes C1 to C5 alkyl, and
n is an integer in the range from 1 to 12,
(c) reacting in a solvent said azole compound with said silane compound such that above defined compound of formula (I) results, and
(d) optionally hydrolyzing the compound of formula (I) obtained in step (c) such that at least one of R is $(CH_2-CH_2-O)_m-Z$ with m=zero and Z=H.

Step (d) is optional and includes the presence of at least some water in order to hydrolyze the compound obtained in step (d) of the method of the present invention. Preferably, such water is added after step (c) in an additional step, e.g. step (d). If such a compound is desired (m=zero and Z=H), step (d) is not optional.

The solvent in step (c) is one or more than one organic solvent and after step (c) of the method of the present invention a mixture according to the present invention is obtained (for the mixture see text above). The aforementioned regarding the mixture applies likewise to the synthesis method of the present invention.

A synthesis route is beneficial, wherein the total molar ratio of the compound of formula (III) to the compound of formula (IV) is in the range from 1:0.85 to 1:1.3, preferably in the range from 1:0.90 to 1:1.25, more preferably in the range from 1:0.95 to 1:1.2, most preferably in the range from 1:1.0 to 1:1.15. If the total molar ratio is significantly higher than 1:1.3 the synthesis product is not sufficiently stable. If the total molar ratio is significantly lower than 1:0.85 too much unreacted educts are present in the synthesis product, which is not desired because the desired species is the azole silane compound comprising the azole and the silane moiety.

A synthesis route is beneficial, wherein in step (c) the temperature is in the range from 50° C. to 90° C., preferably in the range from 60° C. to 85° C.

A synthesis route is beneficial, wherein in step (a) the azole compound of formula (III) is provided as a suspension. This means that it is preferred to suspend the azole compound of formula (III) in at least one solvent such that said azole compound and said at least one solvent form said suspension. For that it is preferred that the at least one solvent is one or more than one organic solvent, preferably is one or more than one water miscible organic solvent. Very preferably the at least one solvent utilized to form said suspension is identical to the solvent utilized in step (c). Most preferred, the azole compound of formula (III) is suspended in one or more than one solvent selected from the group consisting of C1 to C4 alcohols, glycol ethers, and mixtures thereof, preferably selected from the group consisting of C1 to C3 alcohols,
$HO-(CH_2-CH_2-O)_m-Z$, wherein
m is 1, 2, 3, or 4, preferably is 1 or 2, and
Z denotes C1 to C5 alkyl, preferably C3 to C5 alkyl,
and mixtures thereof, more preferably
selected from the group consisting of methanol, diethylene glycol monobutyl ether, ethylene glycol monobutyl ether, and mixtures thereof, most preferably
selected from the group consisting of diethylene glycol monobutyl ether, ethylene glycol monobutyl ether, and mixtures thereof.

A synthesis route is beneficial, wherein in step (c) the reacting is carried out for 1 hour to 48 hours, preferably for 3 hours to 24 hours, more preferably for 5 hours to 20 hours.

The present invention also relates to the specific use of an azole silane compounds (as described throughout the present text, preferably as described as being preferred) and/or an azole silane oligomers (as described throughout the present text, preferably as described as being preferred) in a method for increasing adhesion strength between a surface of a metal, a metal alloy or a metal oxide and a surface of an organic material.

The invention is further explained by the following non-limiting examples.

Examples

A) Synthesis of Azole Silane Compounds:
1) Synthesis of Azole Silane Compound of Formula (Ia):

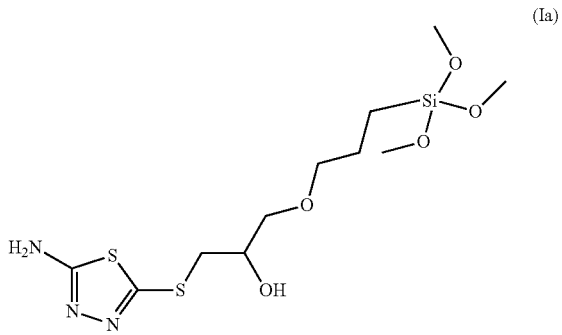 [SMILES: CO[Si](CCCOCC(O)CSc1nnc(N)s1)(OC)OC]

(Ia)

In a first step, 3.68 g (27.1 mmol) 5-amino-1,3,4-thiadiazole-2-thiol (azole compound of formula (III), wherein X denotes $NH_2$ and Y denotes S) were suspended in 70 ml methanol and an azole suspension was obtained.

In a second step, a solution made by dissolving 6.59 g (27.1 mmol) 3-glycidoxypropyltrimethoxysilane (silane compound of formula (IV), wherein R denotes $CH_3$ and n is 3) in 20 ml methanol was added to the azole suspension. As a result, a reaction suspension was obtained.

In a third step, the reaction suspension was heated to reflux (temperature approximately 65° C.) for 18 hours. During that time the suspension turned into a clear solution indicating that the azole compound was fully used up. Afterwards, the solvent (methanol) was removed and approximately 10 g (yield 100%) of a yellow, highly viscous substance were obtained as product, primarily being the azole silane compound of formula (Ia). The thus obtained product was free of any halides and utilized without further purification.

$^1$H NMR: (400 MHz, DMSO-$d_6$) δ 7.24 (s, 2H), 5.22 (d, J=5.4 Hz, 1H), 3.81 (dq, J=7.1, 5.2 Hz, 1H), 3.51-3.43 (m, 8H), 3.41-3.30 (m, 5H), 3.30-3.13 (m, 2H), 3.05 (dd, J=13.1, 7.1 Hz, 1H), 1.59-1.44 (m, 2H), 0.68-0.51 (m, 2H)

ESI-MS: m/z: 369.08 (100.0%), 370.09 (11.9%), 371.08 (9.0%)

Both NMR and ESI-MS confirm the presence of the azole silane compound of formula (Ia).

The theoretical molar mass is 369 g/mol.

2) Synthesis of Azole Silane Compound of Formula (Ib):

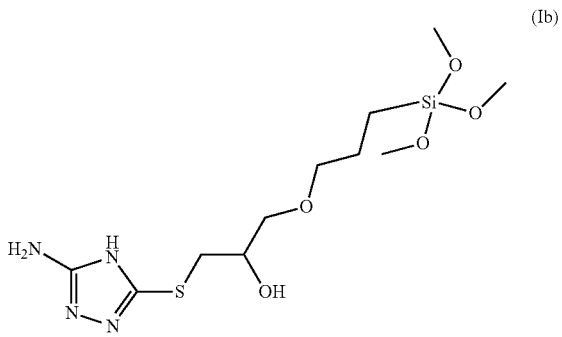 [SMILES: CO[Si](CCCOCC(O)CSc1nnc(N)[nH]1)(OC)OC]

(Ib)

In a first step, 3.36 g (28.4 mmol) 5-amino-4H-1,2,4-triazole-3-thiol (azole compound of formula (III), wherein X denotes $NH_2$ and Y denotes NH) were suspended in 70 ml methanol and an azole suspension was obtained.

In a second step, a solution made by dissolving 6.91 g (28.4 mmol) 3-glycidoxypropyltrimethoxysilane (silane compound of formula (IV), wherein R denotes $CH_3$ and n is 3) in 20 ml methanol was added to the azole suspension. As a result, a reaction suspension was obtained.

In a third step, the reaction suspension was heated to reflux (temperature approximately 65° C.) for 18 hours. During that time the suspension turned into a clear solution indicating that the azole compound was fully used up. Afterwards, the solvent (methanol) was removed and approximately 10 g (yield 100%) of a yellow, highly viscous substance were obtained as product, primarily being the azole silane compound of formula (Ib). The thus obtained product was free of any halides and utilized without further purification.

$^1$H NMR: (400 MHz, DMSO-$d_6$) δ 6.03 (s, 2H), 5.33-5.08 (m, 1H), 3.87-3.75 (m, 1H), 3.54-3.25 (m, 13H), 3.22-3.08 (m, 1H), 2.97 (dd, J=13.3, 7.0 Hz, 1H), 1.55 (dddd, J=12.7, 11.1, 6.6, 3.5 Hz, 2H), 0.67-0.50 (m, 2H)

ESI-MS: m/z: 352.12 (100.0%), 353.13 (11.9%)

Both NMR and ESI-MS confirm the presence of the azole silane compound of formula (Ib). The theoretical molar mass is 352 g/mol.

Above mentioned synthesis of azole silane compound of formula (Ib) was carried out additionally in varying molar rations between the azole compound of formula (III) and the silane compound of formula (IV), such as molar ratios of 1:1.1 and 1:0.9.

3) Synthesis of Azole Silane Compound of Formula (Ib) in DEGBE:

In a first step, 3.36 g (28.4 mmol) 5-amino-4H-1,2,4-triazole-3-thiol (azole compound of formula (III), wherein X denotes $NH_2$ and Y denotes NH) were suspended in 35 ml diethylene glycol monobutyl ether (DEGBE) and an azole suspension was obtained.

In a second step, a solution made by dissolving 6.91 g (28.4 mmol) 3-glycidoxypropyltrimethoxysilane (silane compound of formula (IV), wherein R denotes $CH_3$ and n is 3) in 10 ml DEGBE was added to the azole suspension. As a result, a reaction suspension was obtained.

In a third step, the reaction suspension was heated to 80° C. for 15 hours. During that time the suspension turned into a clear solution indicating that the azole compound was fully used up. Afterwards, a reaction product with a concentration of approximately 18 wt.-% in DEGBE was obtained. The thus obtained product was completely free of any halides and utilized without further purification. Furthermore, no change or removal of solvent was needed as for example described above in examples 1 and 2.

ESI-MS confirms the formation of a compound comprising three methoxy groups connected to the silicon atom. In addition, compounds comprising one, two, or three DEGBE moieties instead of respective methoxy groups also have been identified.

4) Synthesis of Azole Silane Compound of Formula (x) in DEGBE:

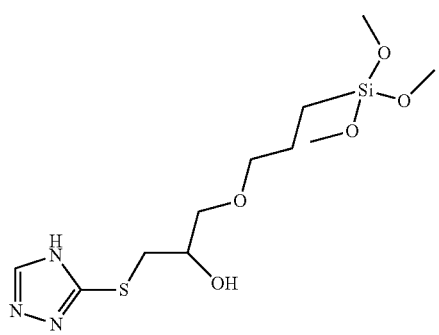

The synthesis procedure as described in example 3 for the synthesis of an azole silane compound of formula (Ib) was performed but instead of 5-amino-4H-1,2,4-triazole-3-thiol, 3-mercapto-1,2,4-triazole was used.

5) Synthesis of Azole Silane Compound of Formula (y):

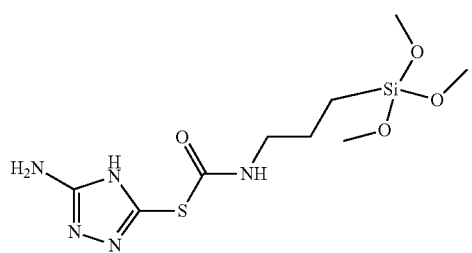

1.88 g (16.2 mmol) of 5-amino-4H-1,2,4-triazole-3-thiol were added to 30 ml DMF. Then a solution of 3.5 g (16.2 mmol) (3-isocyanatopropyl)trimethoxysilane in 10 ml DMF was added dropwise. After the addition the reaction mixture was heated to 60° C. for 6 hours. The solvent was then removed via vacuum. As a result, 5.4 g product as a yellowish viscous oil were obtained, which was subsequently dissolved in 21.6 g DEGBE to give a 20 wt.-% solution.

B) Sample Preparation

Samples 1 to 8 (each comprising several identical specimens) were prepared as follows (see additionally Table 1 below for a summary):

Step (i): Providing the Substrate Having on at Least One Surface a Copper Surface:

Copper foils having a copper surface (150 mm×75 mm×35 μm, supplied by ChangChun China) were used. Under simplified laboratory conditions, copper foils without substrates are used for the examples.

Step (i-a): Cleaning the Copper Surface with an Etch-Cleaning Solution:

In a first step, the copper surfaces of all copper foils for samples 1 to 8 were cleaned at 30° C. for 30 seconds by using a sulfuric acid/$H_2O_2$ solution containing 180 ml/L SoftClean UC168, 200 ml/L CupraEtch Starter, 75 ml/L Hydrox (all products of Atotech), and 545 ml/L DI water, to obtain etch-cleaned copper surfaces. The etch-cleaning removed heavy oxides and other compounds, such as protection layers and/or anti-tarnishes and/or surfactants. After the etch-cleaning the etch-cleaned copper surfaces were rinsed with water for approximately 30 seconds. As a result, etch-cleaned and rinsed copper surfaces were obtained.

Since the commercially available copper foils have a protection layer on the copper surface, this step must be performed under laboratory conditions to remove the protection layer.

Step (i-c): Treating the Copper Surface with an Aqueous Alkaline Solution:

In a second step, the copper surfaces of all substrates for samples 1 to 4, 6, 7, and 8 were treated with an aqueous solution of BondFilm© Cleaner ALK of 100 mL/L (aqueous alkaline solution, 50° C., 30 sec). After the treatment the treated copper surfaces of all copper foils were rinsed with cold water for approximately 30 seconds. The copper surfaces of the copper foils for sample 5 were not treated in this step.

Step (ii): Contacting the Copper Surfaces with Azole Silane Compound of Formula (I) and the Azole Silane Oligomers:

Copper surfaces of all substrates for samples 2 to 8 were immersed for 60 sec at 25° C. into a freshly made coating solution containing approximately 1 weight-% of an azole silane compound and as solvents diethylene glycol monobutyl ether (DEGBE) and DI water. The pH of the coating solution was 7 (adjusted with sulfuric acid). Three different coating solutions have been prepared, each containing a different azole silane compound:

- for sample 2, 5 and 6: azole silane compound of formula (Ib) as synthesized in example 3
- for sample 3: azole silane compound of formula (x) as synthesized in example 4
- for sample 4 and 7: 3-amino-5-[6-(trimethoxysilyl)hexylthio]-1,2,4-triazole as described in Example 1-4 of US 2016/0368935 A1
- for sample 8: compound of formula (y) as disclosed in Formula (Ia-7) of JP 2014-240522 A was used.

Afterwards the resulting copper surfaces of all copper foils were rinsed with cold water for approximately 30 seconds and dried. As a result, silanized and dried copper surfaces of all copper foils for samples 2 to 8 were obtained.

Step (i-a): Annealing:

The copper foils for samples 1 to 8 containing the silanized copper surfaces were than annealed for 30 minutes at 130° C. to remove remaining moisture from the surface. These substrates containing copper surfaces were subsequently subjected to laminating a build-up film (see text below).

Step (iii): Applying the Organic Material onto the Copper Surface of the Substrates:

In a laminating step, an insulating film (Ajinomoto build-up film GXT31 in samples 1 to 5, and 8 or Ajinomoto build-up film GZ41 in samples 6 and 7) was vacuum laminated onto the copper foils of all samples in a clean room with a room temperature in the range from 20 to 25° C. and with a relative humidity of 50 to 60% by using a vacuum laminator.

The conditions for vacuum lamination were as follows: 100° C., vacuum: 30 sec. at 3 hPa, pressure: 30 sec at 0.5 MPa.

After lamination, laminated copper surfaces were obtained.

TABLE 1 overview of sample design

| sample | Etch-cleaning | Alkaline solution | Silane treatment* | Annealing | Insulating Film |
|---|---|---|---|---|---|
| 1# | YES | YES | NO | YES | YES (GXT31) |
| 2 | YES | YES | YES | YES | YES (GXT31) |
| 3# | YES | YES | YES | YES | YES (GXT31) |
| 4# | YES | YES | YES | YES | YES (GXT31) |
| 5 | YES | NO | YES | YES | YES (GXT31) |
| 6 | YES | YES | YES | YES | YES (GZ41) |
| 7# | YES | YES | YES | YES | YES (GZ41) |
| 8# | YES | YES | YES | YES | YES (GXT31) |

*"Silane treatment" is chemically treating the copper surface by an organic compound (attaching the silanes to the cleaned copper surface)
comparative samples Adhesion Evaluation Via Peel Strength Test:

For each sample (1 to 8) obtained after the lamination, peel strength was determined:
(1) Initial,
(2) after 96 hours HAST (HAST conditions: 130° C., 85% rh, HAST chamber: EHS-221 M).

In order to determine the peel strength, several strip-type fragments have been prepared from each specimen by adhering the respective copper foils to a rigid board (identical size as the copper foils) in such a way that the rigid board faced the insulating film. As a result, copper surfaces with structurally enforced insulating films were obtained.

The obtained copper surfaces with structurally enforced insulating films were then cured in an oven at 190° C. for 90 minutes.

Afterwards, each copper surfaces with structurally enforced insulating films was sliced into said strip-type fragments (10×100 mm, Bugard drilling/routing).

The strip-type fragments were subjected to a peel force measuring machine (Roell Zwick Z010) to individually evaluate the peel strength (angle: 90°, speed: 50 mm/min) which is needed to delaminate the copper surface from its respective structurally enforced insulating films. Typically, the higher the peel strength needed to avoid delamination the better is the adhesion.

The peel strength of samples 2 to 8 are shown in Table 2 below.

TABLE 2 peel strength in N/cm:

| sample | Peel Strength [N/cm] initial | Peel Strength [N/cm] after HAST |
|---|---|---|
| 2 | 7.6 | 6.2 |
| 3# | 5.6 | 2.6 |
| 4# | 10.4 | 3.8 |
| 5 | 7.3 | 4.1 |
| 6 | 7.2 | 6.2 |
| 7# | 9.3 | 2.3 |
| 8# | 7.9 | 3.7 |

The initial peel strength of comparative samples 4, 7, and 8 is higher than the initial peel strength of samples 2 and 6 according to the invention but the peel strength of the comparative examples decreases sharply after HAST while peel strength of the samples 2 and 6 remains almost constant.

Peel strength values for sample 1 are lower than the peel strength values of example 2.

Peel strength values for sample 3 are lower than the peel strength values of example 2 and 6.

Although sample 8 showed a comparatively acceptable initial peel strength, an unacceptable drop after HAST was observed. Furthermore, the azole silane compound of formula (y) appears to be generally significantly unstable. After synthesis, significant precipitation occurred, in particular if the azole silane compound is stored under strong alkaline pH conditions (e.g. pH 12). A pH of 12 is typically applied to azole silane compounds of formula (I) for storage purposes in order to minimize premature polymerization of the silane functional groups. However, it appears that under such strong alkaline conditions the amide functional group of the azole silane compound of formula (y), which is not present in azole silane compounds of formula (I), undergoes significant break down. Furthermore, even utilized in a coating solution with pH 7 (which typically ensures a stable silane coating layer) and having a working concentration of approximately 1 wt.-% of the azole silane compound, significant precipitation was again observed. Thus, the azole silane compound of formula (y) appears to be unsuitable for long term utilization in commercial products/applications.

The invention claimed is:

1. A method for increasing adhesion strength between a surface of a metal, a metal alloy or a metal oxide and a surface of an organic material comprising the following steps in this order:
(i) providing a substrate, comprising the metal, metal alloy or metal oxide on at least one side of the substrate,
(ii) contacting at least one section of said metal, metal alloy or metal oxide with
A) an azole silane compound of formula (I)

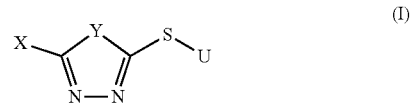

(I)

wherein
X denotes $NH_2$, $NH(NH_2)$, $NH(NHU)$, SH, $SCH_3$, $OCH_3$, NHU, or SU,
Y denotes NH, $N(NH_2)$, N(NHU), or S,
U independently denotes $CH_2$—CH(OH)—$CH_2$—O—$(CH_2)_n$—$Si(OR)_3$, with R independently being $(CH_2$—$CH_2$—$O)_m$—Z, wherein independently
n is an integer in the range from 1 to 12,
m is 0, 1, 2, 3, or 4, and
Z denotes H or C1 to C5 alkyl,
and/or
B) an azole silane oligomer obtained by reacting the azole silane compounds of formula (I) with each other in the presence of water such that the azole silane oligomer comprises at least one silicon-oxygen-silicon moiety,
wherein in the compounds of formula (I) used for the reaction to form the azole silane oligomer
X denotes H, $CH_3$, $NH_2$, $NH(NH_2)$, $N_H(NHU)$, SH, $SCH_3$, $OCH_3$, NHU, or SU, and
Y and U have the meanings given above,
and
(iii) applying the organic material such that the at least one section of the metal, metal alloy or metal oxide contacted with the azole silane compound and/or the azole silane oligomer during step (ii) is in contact with the applied organic material.

2. The method according to claim 1, wherein an aqueous solution of the azole silane compound of formula (I) and/or the azole silane oligomer is used in step (ii).

3. The method according to claim 2, wherein the aqueous solution further comprises one or more than one water miscible organic solvent.

4. The method according to claim 3, wherein the one or more than one water miscible organic solvent comprises a water-miscible organic solvent selected from the group consisting of C1 to C4 alcohols, glycol ethers, and mixtures thereof.

5. The method according to claim 2, wherein the total amount of the azole silane compounds and the azole silane oligomers together is 5 wt.-% or less, based on the total weight of the aqueous solution.

6. The method according to claim 2, wherein the aqueous solution has a pH in the range from 4.8 to 8.6.

7. The method according to claim 1 additionally comprising the following step before conducting step (ii):
 (i-a) contacting the at least one section of said metal, metal alloy or metal oxide with an etch-cleaning solution.

8. The method according to claim 1 additionally comprising the following step before conducting step (ii):
 (i-b) contacting the at least one section of said metal, metal alloy or metal oxide with a etch-cleaning solution.

9. The method according to claim 1 additionally comprising the following step before conducting step (ii):
 (i-c) contacting the at least one section of said metal, metal alloy or metal oxide with an aqueous alkaline solution.

10. The method according to claim 1, wherein the organic material applied in step (iii) is an organic polymer.

11. The method according to claim 1, wherein the organic material is applied in step (iii) by laminating the organic material onto at least the contacted section of the metal, metal alloy or metal oxide.

12. The method according to claim 1, comprising after step (iii) the additional step:
 (iv) subjecting the substrate and the organic material to a heat treatment with a temperature in the range from 142° C. to 420° C.

13. The method according to claim 1, wherein after step (ii), after step (i-a), after step (i-b) and/or after step (i-c), a rinsing of the at least one section of the metal, metal alloy or metal oxide is performed.

14. The method according to claim 1, wherein after step (ii), after step (i-a), after step (i-b) and/or after step (i-c), a drying of the at least one section of metal, metal alloy or metal oxide is performed.

15. The method according to claim 1, wherein the metal, metal alloy or metal oxide is copper, aluminum, titanium, nickel, tin, iron, silver, gold, an alloy comprising at least one of the aforementioned metals, or a metal oxide of at least one of the aforementioned metals.

* * * * *